United States Patent [19]

Berman et al.

[11] Patent Number: 4,625,070
[45] Date of Patent: Nov. 25, 1986

[54] LAMINATED THIN FILM SOLAR MODULE

[75] Inventors: Elliot Berman, Los Angeles; Kimberly P. Eisner, Woodland Hills, both of Calif.

[73] Assignee: Atlantic Richfield Company, Los Angeles, Calif.

[21] Appl. No.: 771,543

[22] Filed: Aug. 30, 1985

[51] Int. Cl.⁴ .................. H01L 31/06; H01L 25/02
[52] U.S. Cl. ............................ 136/249; 136/251; 136/258; 136/259
[58] Field of Search ............... 136/251, 258 AM, 259, 136/249 TJ

[56] References Cited

U.S. PATENT DOCUMENTS

| | | | |
|---|---|---|---|
| 4,400,577 | 8/1983 | Spear | 136/259 |
| 4,461,922 | 7/1984 | Gay et al. | 136/249 |
| 4,510,344 | 4/1985 | Berman | 136/256 |
| 4,517,403 | 5/1985 | Morel et al. | 136/249 |
| 4,571,446 | 2/1986 | Yamazaki | 136/244 |
| 4,578,526 | 3/1986 | Nakano et al. | 136/251 |

FOREIGN PATENT DOCUMENTS 59-94882  5/1984  Japan ................... 136/251

*Primary Examiner*—Aaron Weisstuch
*Attorney, Agent, or Firm*—Albert C. Metrailer

[57] ABSTRACT

A thin film solar module structure comprising a front face untempered glass sheet having a thin film photovoltaic structure fabricated on the back surface thereof, a second glass sheet formed of high strength or tempered glass and a layer of potting or bonding material laminating the two glass sheets into a single composite structure. In the laminated structure, the impact resistance and structural strength of the second glass sheet is effectively transmitted to the untempered front glass sheet which is then suitable for use in unprotected terrestrial applications.

7 Claims, 1 Drawing Figure

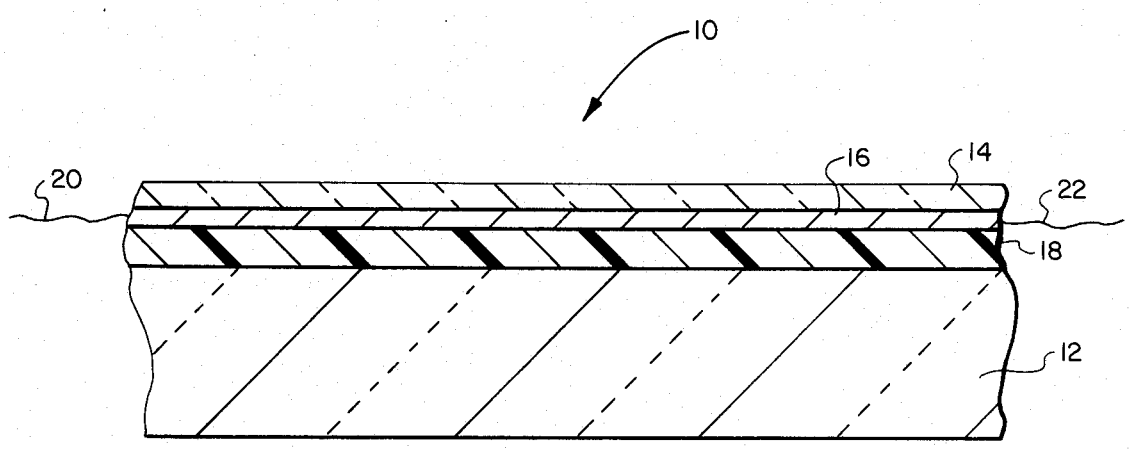

LAMINATED THIN FILM SOLAR MODULE

BACKGROUND OF THE INVENTION

This invention relates generally to solar modules and more particularly to a thin film solar module in which a thin film photovoltaic structure is fabricated on low strength untempered glass and laminated to a high strength glass support to provide a module structure having strength appropriate for use in unprotected terrestrial applications.

References which are relevant to the present invention include U.S. Pat. Nos. 4,461,922 issued to Gay et al on July 24, 1984 and 4,517,403 issued to Morel et al on May 14, 1985. Both of these patents are hereby incorporated by reference for all purposes. These patents each describe a known amorphous silicon thin film photovoltaic structure which forms a part of the preferred embodiment of the present invention. In addition, each of these patents illustrates a basic concept of prior art solar module structures. In such modules, a high strength glass substrate has been used as the primary structural element on which a photovoltaic structure is fabricated, in case of thin film, or to which photovoltaic cells are laminated, in the case of single crystal devices. The glass also forms the light receiving face of the finished module, that is the surface which is exposed to ambient sunlight. Such exposure also means that this face of the device will be exposed to other normal terrestrial weather conditions such as high winds and hail storms. Thus, in addition to supporting the static loads, that is the weight of the various components, the glass substrate must be quite impact resistant. The required strength has been found available in conventional tempered window glass which is, of course, designed for exposure to most of the same weather conditions.

In developing processes for the commercial manufacture of thin film photovoltaic devices, several problems have been encountered. Thus, the conventional wisdom was that the module structure would be very simple since the thin film structure could simply be deposited upon the tempered glass which forms the primary physical structure of the module. However, many of the thin film processes involve temperatures which are sufficiently high to either reduce the tempering in the glass or to actually cause it to break during processing. For example, one method of tempering glass involves heat treatment. It is relatively obvious that reheating of the glass to a temperature near the original heat treating process can relieve the intentionally induced internal stresses which achieve the desired tempering. In another words, the additional heating can to some extent anneal the glass substrate thereby destroying the tempering.

Another problem has been encountered which may be of even more commerical importance. One of the primary advantages of thin film solar devices is the ability to fabricate them on an essentially continuous basis or at least on very large glass substrates. In the past, one of the primary cost limitations on single crystal solar devices was the fact that individual cell size was limited by the maximum diameter to which a silicon crystal could be grown. This was typically in range of four to five inches in diameter. Large modules were therefore necessarily fabricated by assembling a large number of individual cells and laminating them to a support structure. This, of course, required considerable manual labor and was considered an unavoidable cost. The newer thin film devices can theoretically be fabricated on any size glass substrate. The original production efforts have used glass substrates having the dimensions of the desired finished product, for example one foot by one foot or one foot by four foot. However, such arrangements do not take fully advantage of the ability to deposit thin film structures on even larger glass substrates. For example, additional cost reductions could be achieved in manufacture of one foot by one foot modules if the devices were deposited on glass substrates having dimensions of four feet by four feet. In addition, numerous low power applications of thin film photovoltaic structures have been identified, for example power sources for pocket calculators. These applications require very small finished devices which do not need to be tempered since they are used in protected environments at all times. However, it is still desirable to manufacture such small devices on very large substrates to reduce costs.

Thus, it is seen that for all types of thin film photovoltaic devices, production costs can be reduced by fabrication of the devices on glass substrates larger than the desired finished product. After the photovoltaic structures are completely formed on the substrates, they can be easily cut to final dimensions provided that the glass substrate is not tempered. In addition, it is desirable that all glass substrates have essentially the same thickness so that only one set of processing equipment will be required in the factory to again achieve cost reduction based on scale of the operation.

However, for high power terrestrial applications, the finished modules need to have impact resistant front faces as discussed above. In addition it is highly desirable that the glass sheet on which a thin film device is fabricated also be the sheet which forms the light receiving face of the module to reduce losses caused by absorption of incoming light. These requirments have appeared to be totally incompatible with the cost reduction goals discussed above.

SUMMARY OF THE INVENTION

Accordingly, an object of the present invention is to provide an improved thin film solar module structure compatible with low cost, high volume production techniques but having sufficient front face impact strength for normal terrestrial applications.

A solar module according to the present invention comprises a laminated structure of two glass sheets with the first sheet forming the light receiving face of the module and being made of relatively thin untempered glass on which has been deposited a thin film photovoltaic device. The first glass sheet with its photovoltaic device is bonded to a second glass sheet of high strength or tempered glass by means of a potting material which fills all space between the two glass sheets. The second glass sheet provides the primary structural support and gives impact strength to the untempered glass sheet forming the exposed face of the device.

BRIEF DESCRIPTION OF THE DRAWING

The present invention may be better understood by reading the following detailed description of the preferred embodiments which reference to the accompanying single FIGURE which is a cross-sectional illustration of a laminated thin film solar module according to the present invention.

DESCRIPTION OF THE PREFERRED EMBODIMENT

With reference now to the FIGURE, there is provided a cross-sectional illustration of a laminated thin film solar module structure 10 according to the present invention. The primary structural element of this device is a high strength glass sheet 12. In the preferred embodiment, glass 12 is ordinary tempered window glass having a thickness of about three to four millimeters which is widely available and relatively inexpensive. In the preferred embodiment one foot square module sheet 12 is 3.3 millimeters thick. Since glass sheet 12 forms the back surface of the finished device, there is no concern with the ability of this sheet to transmit light. As used in this application, the terms high strength glass or tempered glass are used interchangeably and include any of the known methods or structures for providing high strength glass.

A thin glass sheet 14 forms the front or light receiving face of the solar module. Sheet 14 is thin as compared to sheet 12 and is formed of untempered glass which may easily be cut to size after fabrication of photovoltaic structures. Thus sheet 12 may be common soda lime glass having a thickness of between 0.35 and two millimeters. In the preferred embodiment sheet 14 is 1.1 millimeters thick. Since sheet 14 is relatively thin, it absorbs less of the incoming light than would a thicker glass sheet.

The actual active portion of the module 10 is a thin film photovoltaic structure 16 fabricated on the back face of glass sheet 14. In the preferred embodiment, the photovoltaic structure 16 is a PIN amorphous silicon series connected multi-cell structure. The details of this structure are fully disclosed in the two above-referenced patents by Morel et al and Gay et al. However, any other thin film photovoltaic structure should be quite suitable for use as active device 16 in the present invention.

A final layer 18 of pottant or bonding material is used to laminate front glass sheet 14 and its photovoltaic structure 16 to the back supporting glass substrate 12. In the preferred embodiment, layer 18 comprises primarily ethylene vinyl acetate having the particular formulation specified in the above-referenced Gay et al patent. In the preferred embodiment module, layer 18 is from about 0.4 mm to about 0.5 mm thick. Thicknesses ranging from 0.2 mm to 0.6 mm should also be suitable. Other materials, such as silicone or polyvinylbutyral would also be quite suitable for use as layer 18. Each of these materials has been used in prior art solar cell structures where light must pass through the pottant to reach the actual solar device. These materials are therefore quite good at transmitting light. In the preferred embodiment, transmissivity of layer 18 is actually of no concern since the active device is fabricated directly on the back of the front glass sheet 14. Layer 18 may therefore be entirely opaque if desired. In the particular thin film device structure of Morel et al, the back contact of the device 16 is metallic and therefore reflects all light before it would reach layer 18 anyway. In the thin film structure disclosed in Gay et al, the back contact is transparent to allow light to reach a second photovoltaic device lying below the first. It can be seen by reference to the FIGURE that, if a transparent back contact and transparent pottant are used and the pottant layer 18 is sufficiently thick, a second layer of photovoltaic cells may be imbedded within pottant layer 18 of the present invention if desired. Alternatively a second thin film photovoltaic structure may be deposited on the top surface of glass sheet 12, provided of course that a process compatible with high strength or tempered glass is used.

A completed solar module would of course have electrical leads 20 and 22 connected to allow connection to an external circuit. The finished module would also normally have some type of frame, not shown, to provide further mechanical support and means for mounting the module on a permanent support structure.

Devices fabricated as described above have shown all of the desired characteristics. Thus, it has been possible to fabricate the thin film photovoltaic structure 16 on large substrates which could then be cut to final dimensions. Since the untempered thin glass layer 14 is relatively low strength, however, it would have been anticipated that some protective cover would be required before the final devices could be exposed to normal environmental conditions. However, when laminated to the tempered glass substrate 12, we have found that the final structure is as strong as prior art devices having a tempered glass front face. Thus, the resistance of the finished structure 10 to impact from its front face is at least as strong as the impact resistance of the tempered glass support 12. It appears that the pottant material 18, while being more flexible than either of the glass sheet 12 and 14, quite effectively transmits impact from the front face sheet 14 to the back sheet 12. The result is that the front sheet 14 sustains no damage in the normal impact tests used to qualify solar modules for unprotected terrestrial applications.

While the present invention has been illustrated and described with reference to particular structures, materials and methods of fabrication, it will be appreciated that various modifications or changes therein can be made within the scope of the present invention as defined by the appended claims.

What is claimed is:

1. A solar module comprising:
   a first untempered glass sheet having a first side forming a light receiving face of a solar module and a second side,
   a thin film photovoltaic device fabricated on the second side of said first glass sheet,
   a second tempered glass sheet spaced from the second side of said first sheet and forming the primary structural member of said solar module; and
   a pottant layer filling substantially all space between said first and second glass sheets and bonding said sheets together.

2. A solar module according to claim 1 wherein said first untempered glass sheet has a thickness of from about 0.35 millimeters to about two millimeters and said second glass sheet has a thickness of from about three to about four millimeters.

3. A solar module according to claim 1 wherein said first untempered glass sheet has a thickness of about 1.1 millimeters and said second glass sheet has a thickness of about 3.3 millmeters.

4. A solar module according to claim 1 wherein said thin film photovoltaic device comprises a PIN amorphous silicon structure.

5. A solar module according to claim 1 wherein said pottant material includes as its major constituent a material selected from the group consisting of polyvinylbutyral, silicone, and ethylene vinyl acetate.

6. A solar module according to claim 1 further including a second thin film photovoltaic device fabricated on a surface of said second tempered glass sheet.

7. A solar module according to claim 6 wherein said photovoltaic device on said first glass sheet includes only conductors which are substantially transparent to light, said pottant layer is substantially transparent to light and said second thin film device is positioned to receive light which has passed through said photovoltaic device on said first glass sheet.

* * * * *